US009619377B2

(12) United States Patent
Tripathi et al.

(10) Patent No.: US 9,619,377 B2
(45) Date of Patent: Apr. 11, 2017

(54) SYSTEM ON A CHIP WITH ALWAYS-ON PROCESSOR WHICH RECONFIGURES SOC AND SUPPORTS MEMORY-ONLY COMMUNICATION MODE

(71) Applicant: Apple Inc., Cupertino, CA (US)

(72) Inventors: Brijesh Tripathi, Los Altos, CA (US); Shane J. Keil, San Jose, CA (US); Manu Gulati, Saratoga, CA (US); Jung Wook Cho, Cupertino, CA (US); Erik P. Machnicki, San Jose, CA (US); Gilbert H. Herbeck, Livermore, CA (US); Timothy J. Millet, Mountain View, CA (US); Joshua P. de Cesare, Campbell, CA (US); Anand Dalal, San Jose, CA (US)

(73) Assignee: Apple Inc., Cupertino, CA (US)

( * ) Notice: Subject to any disclaimer, the term of this patent is extended or adjusted under 35 U.S.C. 154(b) by 153 days.

(21) Appl. No.: 14/458,949

(22) Filed: Aug. 13, 2014

(65) Prior Publication Data

US 2015/0347287 A1    Dec. 3, 2015

Related U.S. Application Data

(60) Provisional application No. 62/004,319, filed on May 29, 2014.

(51) Int. Cl.
*G06F 12/02* (2006.01)
*G06F 12/06* (2006.01)
*G06F 1/32* (2006.01)

(52) U.S. Cl.
CPC ........ *G06F 12/0223* (2013.01); *G06F 1/3206* (2013.01); *G06F 1/3287* (2013.01);
(Continued)

(58) Field of Classification Search
CPC ............................. G06F 1/3287; G06F 1/3293
See application file for complete search history.

(56) References Cited

U.S. PATENT DOCUMENTS

| 6,593,845 B1 | 7/2003 | Friedman |
| 6,748,548 B2 * | 6/2004 | Bormann ............ G06F 13/4022 |
| | | 713/300 |

(Continued)

FOREIGN PATENT DOCUMENTS

| DE | 102013224175 A1 | 5/2014 |
| TW | 201342238 A | 10/2013 |

OTHER PUBLICATIONS

Written Opinion, International Application No. PCT/US2015/020330, mailed Jun. 8, 2015, 7 pages.

(Continued)

*Primary Examiner* — Jaweed A Abbaszadeh
*Assistant Examiner* — Cheri Harrington
(74) *Attorney, Agent, or Firm* — Meyertons, Hood, Kivlin, Kowert & Goetzel, P.C.; Lawrence J. Merkel

(57) ABSTRACT

In an embodiment, a system on a chip (SOC) includes a component that remains powered when the remainder of the SOC is powered off. The component may include a sensor capture unit to capture data from various device sensors, and may filter the captured sensor data. Responsive to the filtering, the component may wake up the remainder of the SOC to permit the processing. The component may store programmable configuration data, matching the state at the time the SOC was most recently powered down, for the other components of the SOC, in order to reprogram them after wakeup. In some embodiments, the component may be configured to wake up the memory controller within the
(Continued)

SOC and the path to the memory controller, in order to write the data to memory. The remainder of the SOC may remain powered down.

20 Claims, 10 Drawing Sheets

(52) U.S. Cl.
CPC ........ *G06F 1/3293* (2013.01); *G06F 12/0646* (2013.01); *G06F 2212/1032* (2013.01); *Y02B 60/121* (2013.01); *Y02B 60/1282* (2013.01); *Y02B 60/32* (2013.01)

(56) References Cited

U.S. PATENT DOCUMENTS

| | | | |
|---|---|---|---|
| 6,775,750 | B2 | 8/2004 | Krueger |
| 7,120,771 | B2 | 10/2006 | Dahan et al. |
| 7,797,523 | B2 | 9/2010 | Hobson et al. |
| 7,890,753 | B2 | 2/2011 | Dahan et al. |
| 7,991,992 | B2 | 8/2011 | Guan et al. |
| 8,112,618 | B2 | 2/2012 | Brokish |
| 8,583,953 | B2 * | 11/2013 | Sultenfuss ............ G06F 1/3203 713/320 |
| 2004/0221185 | A1 | 11/2004 | Bose |
| 2008/0168286 | A1* | 7/2008 | Tupman ................ G06F 1/3203 713/320 |
| 2008/0282101 | A1* | 11/2008 | Adams .................. G06F 1/3287 713/322 |
| 2009/0259854 | A1 | 10/2009 | Cox |
| 2009/0259865 | A1 | 10/2009 | Sheynblat et al. |
| 2010/0131681 | A1 | 5/2010 | Reddy |
| 2011/0154484 | A1 | 6/2011 | Shimabe |
| 2012/0005526 | A1 | 1/2012 | Sela |
| 2012/0254878 | A1 | 10/2012 | Nachman et al. |
| 2013/0073884 | A1 | 3/2013 | Ulmer et al. |
| 2013/0111092 | A1 | 5/2013 | Heller et al. |
| 2013/0173938 | A1* | 7/2013 | Yang ........................ G06F 1/26 713/300 |
| 2013/0261814 | A1 | 10/2013 | Shrall et al. |
| 2013/0326206 | A1 | 12/2013 | Lueck et al. |
| 2014/0009650 | A1 | 1/2014 | Kim et al. |
| 2014/0075226 | A1 | 3/2014 | Heo et al. |
| 2014/0149770 | A1* | 5/2014 | Ahmad ................. G06F 1/3228 713/323 |
| 2014/0223217 | A1 | 8/2014 | Nabhane |
| 2014/0369495 | A1 | 12/2014 | Muchsel |
| 2015/0089245 | A1 | 3/2015 | Altman |
| 2015/0106631 | A1 | 4/2015 | Bettendorff |
| 2015/0127300 | A1* | 5/2015 | Bluming ................ G01D 21/02 702/189 |
| 2015/0248568 | A1 | 9/2015 | Offenberg |

OTHER PUBLICATIONS

Search Report, International Application No. PCT/US2015/020330, mailed Jun. 8, 2015, 4 pages.
U.S. Appl. No. 14289775, filed May 29, 2014, Anand Dalai.
U.S. Appl. No. 14/458,885, filed Aug. 13, 2014, Brijesh Tripathi.
U.S. Appl. No. 14/463,763, filed Aug. 20, 2014, Joshua P. de Cesare.
Notice of Allowance, ROC (Taiwan) Patent Application No. 104111311, mailed Mar. 17, 2016, 3 pages.
Search Report, ROC (Taiwan) Patent Application No. 104111311, mailed Mar. 17, 2016, 1 page.
Office Action, US. U.S. Appl. No. 14/463,763, Joshua P. de Cesare, mailed Feb. 23, 2016, 22 pages.
Office Action, U.S. Appl. No. 14/289,775, Anand Dalai, mailed Jan. 29, 2016, 16 pages.

\* cited by examiner

SYSTEM ON A CHIP WITH ALWAYS-ON PROCESSOR WHICH RECONFIGURES SOC AND SUPPORTS MEMORY-ONLY COMMUNICATION MODE

This application claims benefit of priority to U.S. Provisional Patent Application Ser. No. 62/004,319, filed on May 29, 2014, incorporated herein by reference in its entirety.

BACKGROUND

Technical Field

Embodiments described herein are related to the field of systems on a chip (SOCs) and, more particularly, to an always-on block in an SOC.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality such as various PDA functionality and/or general application support, tablets, laptops, net tops, smart watches, wearable electronics, etc. Generally, a mobile device may be any electronic device that is designed to be carried by a user or worn by a user. The mobile device is typically battery powered so that it may operate away from a constant electrical source such as an electrical outlet.

Many mobile devices may operate in a "standby" mode much of the time. In the standby mode, the device may appear to be "off," in as much as the device is not actively displaying content for the user and/or not actively performing functionality for the user. In the standby mode, much of the device may indeed by powered off. However, in the background, the device may be listening for phone calls or network packets, checking for alarms, reacting to movement, etc.

Because the mobile devices are often operating from a limited supply (e.g. a battery), energy conservation is a key design consideration for the devices. Including a system on a chip (SOC) can aid in energy conservation, since much of the functionality needed in the device can be included in the SOC. In "standby" mode and other low power modes, it is desirable to power down the SOC to eliminate leakage current losses, which are a significant factor in energy consumption in modern integrated circuit technologies. On the other hand, the SOC is needed for some of the standby functionality mentioned above.

SUMMARY

In an embodiment, an SOC includes a component that remains powered when the remainder of the SOC is powered off. The component may include a sensor capture unit configured to capture data from various device sensors. The captured sensor data may be buffered in a memory within the component. The component may further include a processor, in some embodiments, which may filter the captured sensor data searching for patterns that may indicate a need for further processing by the device. If the need for further processing is detected, the component may wake up (i.e. cause to power up and reprogram) the remainder of the SOC to permit the processing. Power/energy consumption may be reduced while still supporting the capture of sensor data during times that the device is not actively in use, in some embodiments. For example, the power/energy efficiencies that may be obtained through integration of the component on the integrated circuit may be achieved while supporting the sensor data capture. The component may store programmable configuration data for the other components of the SOC in order to reprogram them after wakeup. The programmable configuration data may match the state of the component at the time the SOC was most recently powered down (while the component remained powered) or may be a different state desired for wakeup.

In some embodiments, the component may be configured to wake up both the memory controller within the SOC and the path to the memory controller, in order to write the data to memory and/or read data from memory. The remainder of the SOC may remain powered down. In this manner, the component may take advantage of the larger main memory to store data (e.g. sensor data) without waking the other components (e.g. including a central processing unit (CPU) processor or processors) to permit the transfer. Power/energy consumption may be reduced because only the needed components are powered up.

In some embodiments, the saving of the programmable configuration data and restoring the data from the component may reduce latency when powering up again from a powered down (e.g. sleep) state in the SOC. In some embodiments, the processing of data at one state (e.g. the processor in the component awake while the SOC is asleep) may result in speculation that a higher power/performance state may soon be needed. The SOC may transition speculatively to the state, and thus may be even lower latency to awaken if the speculation is accurate.

BRIEF DESCRIPTION OF THE DRAWINGS

The following detailed description makes reference to the accompanying drawings, which are now briefly described.

Figure 1:
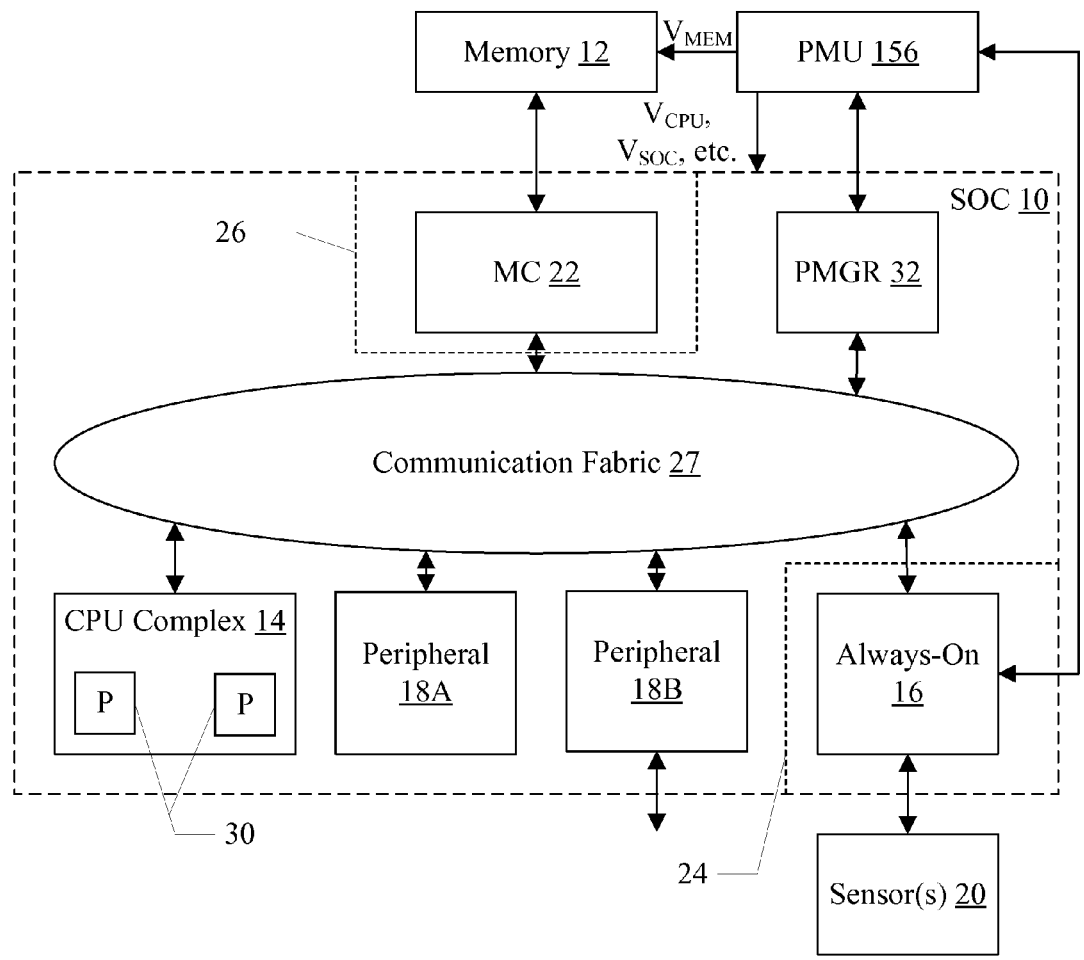
FIG. 1 is a block diagram of one embodiment of an SOC.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

Turning now to FIG. 1, a block diagram of one embodiment of an SOC 10 is shown coupled to a memory 12, at least one sensor 20, and a power management unit (PMU) 156. As implied by the name, the components of the SOC 10 may be integrated onto a single semiconductor substrate as an integrated circuit "chip." In some embodiments, the components may be implemented on two or more discrete chips in a system. However, the SOC 10 will be used as an example herein. In the illustrated embodiment, the components of the SOC 10 include a central processing unit (CPU) complex 14, an "always-on" component 16, peripheral components 18A-18B (more briefly, "peripherals"), a memory controller 22, a power manager (PMGR) 32, and a communication fabric 27. The components 14, 16, 18A-18B, 22, and 32 may all be coupled to the communication fabric 27. The memory controller 22 may be coupled to the memory 12 during use. The PMGR 32 and the always-on component 16 may be coupled to the PMU 156. The PMU 156 may be configured to supply various power supply voltage to the SOC, the memory 12, and/or the sensors 20. The always-on component 16 may be coupled to the sensors 20. In the illustrated embodiment, the CPU complex 14 may include one or more processors (P 30 in FIG. 1). The processors 30 may form the CPU(s) of the SOC 10.

The always-on component 16 may be configured to remain powered up when other components of the SOC 10 (e.g. the CPU complex 14, the peripherals 18A-18B, and the PMGR 32) are powered down. More particularly, the always-on component 16 may be on whenever the SOC 10 is receiving power from the PMU 156. Thus, the always-on component is "always-on" in the sense that it may be powered if the SOC 10 is receiving any power (e.g. at times when the device including the SOC 10 is in standby mode or is operating actively), but may not be powered when the SOC 10 is not receiving any power (e.g. at times when the device is completely turned off). The always-on component 16 may support certain functions while the remainder of the SOC 10 is off, allowing low power operation.

In FIG. 1, a dotted line 24 separating the always-on component 16 from the other components may indicate an independent power domain for the always-on component 16. Similarly, in the illustrated embodiment, a dotted line 26 may represent an independent memory controller power domain for the memory controller 22. Other components, groups of components, and/or subcomponents may have independent power domains as well. Generally, a power domain may be configured to receive supply voltage (i.e. be powered on) or not receive supply voltage (i.e. be powered off) independent of other power domains. In some embodiments, power domains may be supplied with different supply voltage magnitudes concurrently. The independence may be provided in a variety of fashions. For example, the independence may be provided by providing separate supply voltage inputs from the PMU 156, by providing power switches between the supply voltage inputs and components and controlling the power switches for a given domain as a unit, and/or a combination of the above. There may be more power domains than those illustrated in FIG. 1 as well. For example, the CPU complex 14 may have an independent power domain (and each CPU processor 30 may have an independent power domain as well) in an embodiment. One or more peripheral components 18A-18B may be in one or more independent power domains in an embodiment.

As illustrated in FIG. 1, the always-on component 16 may be coupled to at least one sensor 20 (and may be coupled to multiple sensors 20). The always-on component 16 may be configured to read the sensor data from the sensors 20 while the SOC 10 is powered off (in addition to the times when the SOC 10 is powered on). The always-on component 16 may include a memory (not shown in FIG. 1) to buffer the sensor data, and the remainder of the SOC 10 need not be powered up unless the memory (or a portion thereof allocated to store sensor data) fills with data (or reaches a threshold level of fullness). In some embodiments, the always-on component 16 may be configured to process the sensor data in some fashion as well. For example, the always-on component 16 may be configured to filter the sensor data. Filtering data may generally refer to one or more of: searching for a pattern or other data properties that indicate that the sensor data should be further processed by the processors in the CPU complex 14; manipulating the data to detect/remove noise in the data; further processing data that appears to match a pattern or other property to eliminate false positive matches; etc.

The sensors 20 may be any devices that are configured to detect or measure aspects of the physical environment of a device that includes the sensors. For example, a sensor may include an accelerometer which measures acceleration of the device. An accelerometer may be directional (measuring acceleration in a predetermined direction) or vector (measuring acceleration in multiple dimensions and producing a vector indicating the acceleration and its direction). Multiple directional accelerometers may be employed to permit vector acceleration sensing as well as directional acceleration sensing. Another example of a sensor may be gyroscope (or gyro). The gyroscope may be used to detect the orientation of the device and/or changes in orientation. Like the accelerometer, the gyroscope may be directional or multidimensional, and/or multiple directional gyroscopes may be used. Yet another sensor may be a magnetometer, which may be used to measure magnetic orientation and thus may be used to form a compass. In other embodiments, the compass functionality may be embedded in the sensor. Another sensor may be an audio detector (e.g. a microphone). The audio detector may capture sound and generate data indicative of the sound. Another sensor may be a photodetector that detects light or other electromagnetic energy. Other exemplary sensors may include an altimeter to detect altitude, a temperature sensor, and/or a pressure sensor. Still another sensor may be a user interface device such as a button, a touch screen, a keyboard, a pointing device, a camera, etc. Any set of sensors may be employed.

As mentioned above, the always-on component 16 may be configured to buffer data in a memory within the component. If the buffer is nearing full, the always-on component 16 may be configured to wake the memory controller 22 in order to write the sensor data to the memory 12. In some embodiments, the always-on component 16 may be configured to write results of filtering the data to the memory 12. In some embodiments, the always-on component 16 may perform other processing tasks while the rest of the SOC 10 is powered down. To the extent that these tasks access the memory 12, the always-on component 16 may be configured to wake the memory controller 22. In addition, the always-on component 16 may be configured to wake at least a portion of the communication fabric 27 (i.e. the portion that connects the always-on component 16 to the memory controller 22).

Using this memory-only communication mode, the always-on component 16 may be able to access the memory 12 and take advantage of the significant storage available in the memory 12 while expending a relatively low amount of energy/power, since the remainder of the SOC 10 remains powered down. The always-on component 16 may store programmable configuration data for the memory controller 22, so that the always-on component 16 may program the memory controller 22 once power is restored. That is, the always-on component 16 may be configured to program the memory controller 22 in a manner similar to the way the operating system would program the memory controller 22 during boot of the device including the SOC 10. The programmable configuration data stored by the always-on component 16 may be the configuration data that was in the memory controller 22 when the SOC 10 (except for the always-on component 16) was most recently powered down, in one embodiment. In another embodiment, the programmable configuration data may be a configuration that is known to work for any previous configuration of the memory controller 22 and/or any configuration of the memory 12. The known-good configuration may, e.g., be a configuration that is acceptable in performance for the memory accesses by the always-on component 16.

When the SOC 10 is powered down with the always-on component 16 remaining powered, part of the power down sequence may be to place the memory 12 in a retention mode. For example, for dynamic random access memory (DRAM) embodiments of the memory 12, the retention mode may be a "self-refresh" mode. In retention mode, the memory 12 may not be externally accessible until the mode is changed. However, the contents of the memory 12 may be preserved. For example, in the self-refresh mode, the DRAM may perform the periodic refreshes needed to retain data (which are normally performed by the memory controller 22, when the memory controller 22 is powered on).

In some embodiments, the always-on component 16 may further store programmable configuration data for other components in the SOC 10. The programmable configuration data may reflect the state of the components at the time that the remainder of the SOC 10 was most recently powered down. The always-on component 16 may be configured to wake the SOC 10 for processing, and may reprogram the components with the stored programmable configuration data. The process of restoring state to the components based on the stored programmable configuration data may be referred to as reconfiguration. Again, similar to the memory-only communication mode discussed above, the state that is restored to the components may be the state at the most recent power down of the component or may be a known-good state with acceptable performance for restarting the SOC 10 for operation. In the latter case, the state may be modified to a higher performance state after the reconfiguration has completed.

Restoring state using the reconfiguration functionality in the always-on component 16 may be a lower latency operation than restoring power in the SOC 10 and then initializing the SOC 10 and the operating system in a manner similar to a cold boot. During the initialization without the always-on component 16, the operating system discovered that the SOC 10 was previously powered down with system state stored in the memory 12, and bypassed some initialization operations. However, the latency of the restore was greater than desired. Additional details for one embodiment are discussed in more detail below.

The always-on component 16 may be configured to communicate with the PMU 156, in addition to the communication of the PMGR 32 to the PMU 156. The interface between the PMU 156 and the always-on component 16 may permit the always-on component 16 to cause components to be powered up (e.g. the memory controller 22, or the other components of the SOC 10) when the PMGR 32 is powered down. The interface may also permit the always-on component 16 to control its own power state as well.

Generally, a component may be referred to as powered on or powered off. The component may be powered on if it is receiving supply voltage so that it may operate as designed. If the component is powered off, then it is not receiving the supply voltage and is not in operation. The component may also be referred to as powered up if it is powered on, and powered down if it is powered off. Powering up a component may refer to supplying the supply voltage to a component that is powered off, and powering down the component may refer to terminating the supply of the supply voltage to the component. Similarly, any subcomponent and/or the SOC 10 as a whole may be referred to as powered up/down, etc. A component may be a predefined block of circuitry which provides a specified function within the SOC 10 and which has a specific interface to the rest of the SOC 10. Thus, the always-on component 16, the peripherals 18A-18B, and the CPU complex 14, the memory controller 22, and the PMGR 32 may each be examples of a component.

A component may be active if it is powered up and not clock gated. Thus, for example, a processor in the CPU complex 14 may be available for instruction execution if it is active. A component may be inactive if it is powered off or in another low power state in which a significant delay may be experienced before instructions may be executed. For example, if the component requires a reset or a relock of a phase lock loop (PLL), it may be inactive even if it remains powered. A component may also be inactive if it is clock gated. Clock gating may refer to techniques in which the clock to the digital circuitry in the component is temporarily "turned off," preventing state from being captured from the digital circuitry in clocked storage devices such as flops, registers, etc.

As mentioned above, the CPU complex 14 may include one or more processors 30 that may serve as the CPU of the SOC 10. The CPU of the system includes the processor(s) that execute the main control software of the system, such as an operating system. Generally, software executed by the CPU during use may control the other components of the system to realize the desired functionality of the system. The processors may also execute other software, such as application programs. The application programs may provide user functionality, and may rely on the operating system for lower-level device control, scheduling, memory management, etc. Accordingly, the processors may also be referred to as application processors. The CPU complex 14 may further include other hardware such as an L2 cache and/or an interface to the other components of the system (e.g. an interface to the communication fabric 27).

An operating point may refer to a combination of power supply voltage magnitude and operating frequency for the CPU complex 14, the always-on component 16, other components of the SOC 10, etc. The operating frequency may be the frequency of the clock that clocks the component. The operating frequency may also be referred to as the clock frequency or simply the frequency. The operating point may also be referred to as an operating state or power state. The operating point may be part of the programmable configuration data that may be stored in the always-on component 16 and reprogrammed into the components when reconfiguration occurs.

Generally, a processor may include any circuitry and/or microcode configured to execute instructions defined in an instruction set architecture implemented by the processor. Processors may encompass processor cores implemented on an integrated circuit with other components as a system on a chip (SOC 10) or other levels of integration. Processors may further encompass discrete microprocessors, processor cores and/or microprocessors integrated into multichip module implementations, processors implemented as multiple integrated circuits, etc.

The memory controller 22 may generally include the circuitry for receiving memory operations from the other components of the SOC 10 and for accessing the memory 12 to complete the memory operations. The memory controller 22 may be configured to access any type of memory 12. For example, the memory 12 may be static random access memory (SRAM), dynamic RAM (DRAM) such as synchronous DRAM (SDRAM) including double data rate (DDR, DDR2, DDR3, DDR4, etc.) DRAM. Low power/mobile versions of the DDR DRAM may be supported (e.g. LPDDR, mDDR, etc.). The memory controller 22 may include queues for memory operations, for ordering (and potentially reordering) the operations and presenting the operations to the memory 12. The memory controller 22 may further include data buffers to store write data awaiting write to memory and read data awaiting return to the source of the memory operation. In some embodiments, the memory controller 22 may include a memory cache to store recently accessed memory data. In SOC implementations, for example, the memory cache may reduce power consumption in the SOC by avoiding reaccess of data from the memory 12 if it is expected to be accessed again soon. In some cases, the memory cache may also be referred to as a system cache, as opposed to private caches such as the L2 cache or caches in the processors, which serve only certain components. Additionally, in some embodiments, a system cache need not be located within the memory controller 22.

The peripherals 18A-18B may be any set of additional hardware functionality included in the SOC 10. For example, the peripherals 18A-18B may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include interface controllers for various interfaces external to the SOC 10 (e.g. the peripheral 18B) including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

The communication fabric 27 may be any communication interconnect and protocol for communicating among the components of the SOC 10. The communication fabric 27 may be bus-based, including shared bus configurations, cross bar configurations, and hierarchical buses with bridges. The communication fabric 27 may also be packet-based, and may be hierarchical with bridges, cross bar, point-to-point, or other interconnects.

The PMGR 32 may be configured to control the supply voltage magnitudes requested from the PMU 156. There may be multiple supply voltages generated by the PMU 156 for the SOC 10. For example, illustrated in FIG. 1 are a $V_{CPU}$ and a $V_{SOC}$. The $V_{CPU}$ may be the supply voltage for the CPU complex 14. The $V_{SOC}$ may generally be the supply voltage for the rest of the SOC 10 outside of the CPU complex 14. For example, there may be separate supply voltages for the memory controller power domain and the always-on power domain, in addition to the $V_{SOC}$ for the other components. In another embodiment, $V_{SOC}$ may serve the memory controller 22, the always-on component 16, and the other components of the SOC 10 and power gating may be employed based on the power domains. There may be multiple supply voltages for the rest of the SOC 10, in some embodiments. In some embodiments, there may also be a memory supply voltage for various memory arrays in the CPU complex 14 and/or the SOC 10. The memory supply voltage may be used with the voltage supplied to the logic circuitry (e.g. $V_{CPU}$ or $V_{SOC}$), which may have a lower voltage magnitude than that required to ensure robust memory operation. The PMGR 32 may be under direct software control (e.g. software may directly request the power up and/or power down of components) and/or may be configured to monitor the SOC 10 and determine when various components are to be powered up or powered down.

The PMU 156 may generally include the circuitry to generate supply voltages and to provide those supply voltages to other components of the system such as the SOC 10, the memory 12 ($V_{MEM}$ in FIG. 1), various off-chip peripheral components (not shown in FIG. 1) such as display devices, image sensors, user interface devices, etc. The PMU 156 may thus include programmable voltage regulators, logic to interface to the SOC 10 and more particularly the PMGR 32 to receive voltage requests, etc.

It is noted that the number of components of the SOC 10 (and the number of subcomponents for those shown in FIG. 1, such as within the CPU complex 14) may vary from embodiment to embodiment. There may be more or fewer of each component/subcomponent than the number shown in FIG. 1.

Figure 2:
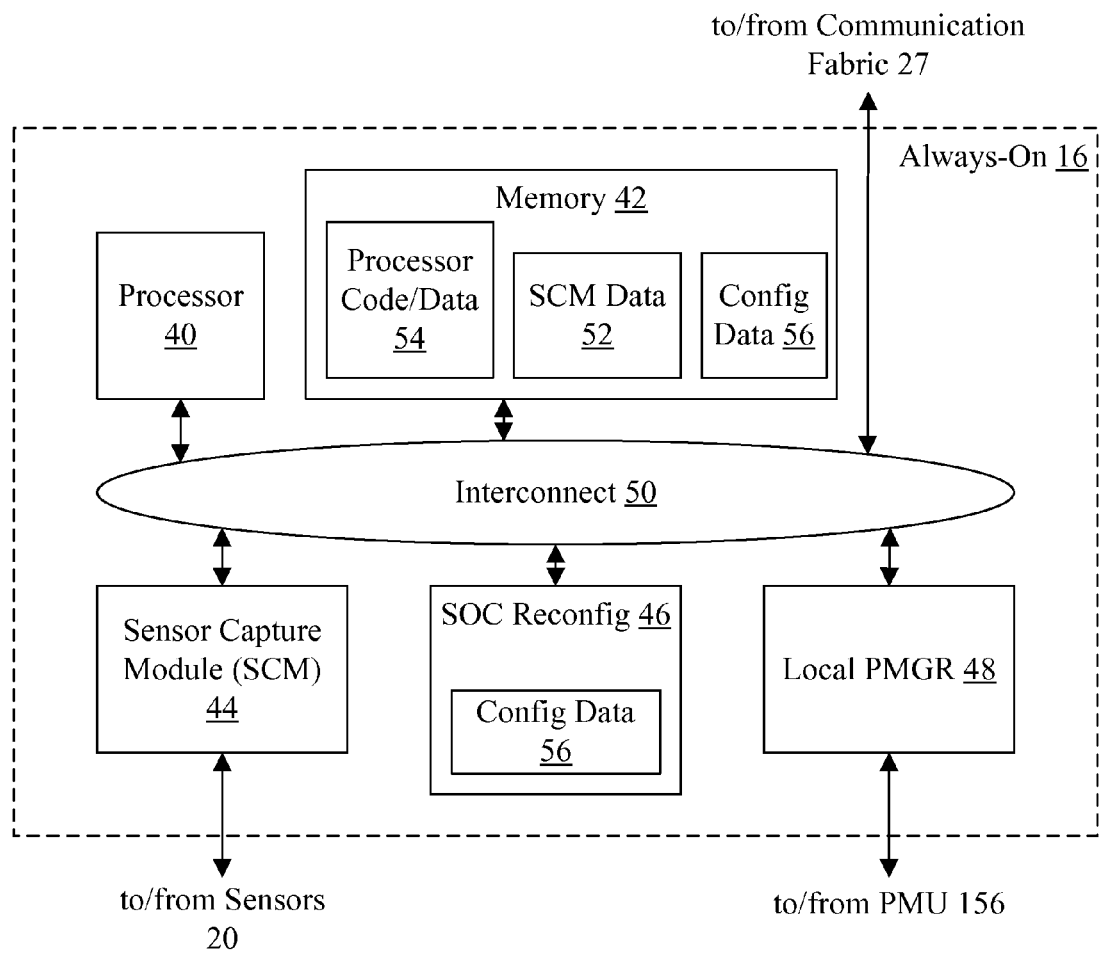
FIG. 2 is a block diagram of one embodiment of an always-on block in the SOC.

Turning now to FIG. 2, a block diagram of one embodiment of the always-on component 16 is shown. In the illustrated embodiment, the always-on component 16 may include a processor 40, a memory 42, a sensor capture module (SCM) 44, an SOC reconfiguration circuit 46, a local PMGR 48, and an interconnect 50. The processor 40, the memory 42, the SCM 44, the SOC reconfiguration circuit 46, and the local PMGR 48 are coupled to the interconnect 50. The SCM 44 may also be referred to as a sensor capture unit or a sensor capture circuit.

The sensor capture module 44 may be coupled to the sensors 20 when the SOC 10 is included in a system, and may be configured to capture data from the sensors 20. In the illustrated embodiment, the sensor capture module 44 may be configured to write the captured sensor data to the memory 42 (SCM Data 52). The memory 42 may be an SRAM, for example. However, any type of memory may be used in other embodiments.

The SCM data 52 may be stored in locations that are preallocated by the always-on component 16 to store captured sensor data. As the locations are consumed, the amount of available memory to store captured data decreases. The sensor capture module 44 may be programmed with a watermark or other indication of fullness in the allocation memory area (generally, e.g., a "threshold"), and the sensor capture module 44 may be configured to wake the memory controller 22 to write the captured sensor data to memory 12. Alternatively, the processor 40 may be configured to write the captured sensor data to memory 12. In such a case, the sensor capture module 44 may be configured to wake the processor 40.

The processor 40 may be configured to execute code stored in the memory 42 (processor code/data 54). The code may include a series of instructions which, when executed, cause the processor 40 to implement various functions. For example, the code may include filter code which may be executed by the processor 40 to filter the SCM data 52, as discussed above. Responsive to detecting a desired pattern or other data attribute(s) in the SCM data 52, the processor 40 may be configured to wake the memory controller 22 to update the memory 12 and/or to wake the SOC 10.

The processor code/data 54 may be initialized upon boot of a device including the SOC 10. The code may be stored in a non-volatile memory on the SOC 10 or elsewhere in the device, and may be loaded into the memory 42, for example. A local non-volatile memory such as read-only memory (ROM) may also be used in some embodiments.

In an embodiment, the processor 40 may be a smaller, more power efficient processor than the CPU processors 30 in the CPU complex 14. Thus, the processor 40 may consume less power when active than the CPU processors 30 consume. There may also be fewer processors 40 than there are CPU processors 30, in an embodiment.

The SOC reconfiguration circuit 46 may be configured to store the programmable configuration data 56 for the memory controller 22 and the other components of the SOC 10, to reprogram various components responsive to powering the components back up from a powered off state. Alternatively, the programmable configuration data 56 may be stored in the memory 42, or in a combination of the memory 42 and the SOC reconfiguration circuit 46. The configuration data 56 may be written to the circuit 46 by the CPU processors 30, e.g. as part of programming the corresponding component. That is, the CPU processors 30 (executing operating system software, for example, as part of the boot of the device and/or at other times when the configuration is changed) may write the data to the SOC reconfiguration circuit 46. Alternatively, in some embodiments, the SOC reconfiguration circuit 46 may have hardware that monitors and shadows the configuration state. In some embodiments, at least a portion of the programmable configuration data 56 may be predetermined and may be stored in a non-volatile memory such as a ROM, rather than being written to the memory 42 and/or the SOC reconfiguration circuit 46.

In an embodiment, the SOC reconfiguration circuit 46 may include logic circuitry configured to process the programmable configuration data 56 and to write the data to the corresponding components in the SOC 10 after the SOC 10 is powered up again. The programmable configuration data 56 may include a series of register addresses to be written and the data to write to those registers. In some embodiments, the programmable configuration data 56 may further include read commands to read registers, e.g. polling for an expected value that indicates that the initialization performed by various writes is complete and/or the corresponding state is in effect in the component. The expected value may be the entire value read, or may be a portion of the value (e.g. the expected value may include a value and a mask to be applied to the read value prior to comparison). In some embodiments, the programmable configuration data 56 may further include read-modify-write commands to read registers, modify a portion of the read data, and write the modified data back to the register. For example, a second mask may be used to determine which portion of the register value is to be updated. The portion of the register masked by the second mask may not be updated when the value is written to the register.

In another embodiment, the SOC reconfiguration circuit 46 may include another processor and corresponding memory storing code for the processor (or the code may also be stored in the memory 42). The code, when executed by the processor, may cause the processor to configure the various components in the SOC 10 with the programmable configuration data 56. The code may implement the polling features described above as part of the structure of the code itself, or the programmable configuration data 56 may store the address to poll and the expected value, similar to the above discussion. In another embodiment, the processor 40 may execute software to reprogram the components of the SOC 10.

The programmable configuration data 56 may include data for the memory controller 22, separate data for other components of the SOC 10, and separate data for the reconfiguring the processor 40 when it is powered up. When powering up the memory controller 22 while the remainder of the SOC 10 is powered down, the data for the memory controller 22 may be processed. The data may include programmable configuration data for the memory controller 22. The data may further include additional programmable configuration data, in an embodiment. For example, programmable configuration data for the communication fabric 27 may be included. Programmable configuration data may be included for whichever components are used in communication between the always-on component 16 and the memory controller 22. When powering up the remainder of the SOC 10, the data for the other components may be processed. Similarly, when powering up the processor 40, the programmable configuration data for the processor 40 may be processed.

In some embodiments, the SOC reconfiguration circuit 46 may be configured to provide programmable configuration data to components of the SOC 10 at more than one point in the power up of the SOC 10. For example, some programmable reconfiguration data may be provided near the beginning of the transition to powered on (e.g., shortly after the power supply voltage is stable), and other programmable reconfiguration data may be provide nearer the end of the transition to powered on. Furthermore, in some embodiments, the programmable configuration data 56 may be only a portion of the programmable configuration to be established in the components of the SOC 10. The remainder of the programmable configuration may be stored in the memory 12. For example, operating system software executing on the CPU processors 30 may capture the programmable configuration in the memory 12 prior to powering down. The restoration of programmable configuration data stored in the memory 12 may be performed by the SOC reconfiguration circuit 46, other hardware, and/or the operating system software after the CPU processors 30 have been released from reset and begin execution again.

The local PMGR 48 may be configured to handle power management functions within the always-on component 16, in a manner similar to the PMGR 32 in FIG. 1 for the SOC 10 as a whole. The always-on component 16 may support multiple power states, and the local PMGR 48 may assist with transitions between those states. The local PMGR 48 may be configured to communicate with the PMU 156 to support state changes, as well as to manage the providing of supply voltages to various components of the SOC 10 as part of waking up or putting to sleep various components.

The interconnect 50 may comprise any interconnect to transmit communications between the various subcomponents shown in FIG. 2, as well as to communicate over the communication fabric 27 with other components of the SOC 10. The interconnect may include any of the examples of the communication fabric 27 discussed above with regard to FIG. 1, as desired, in various embodiments.

Figure 3:
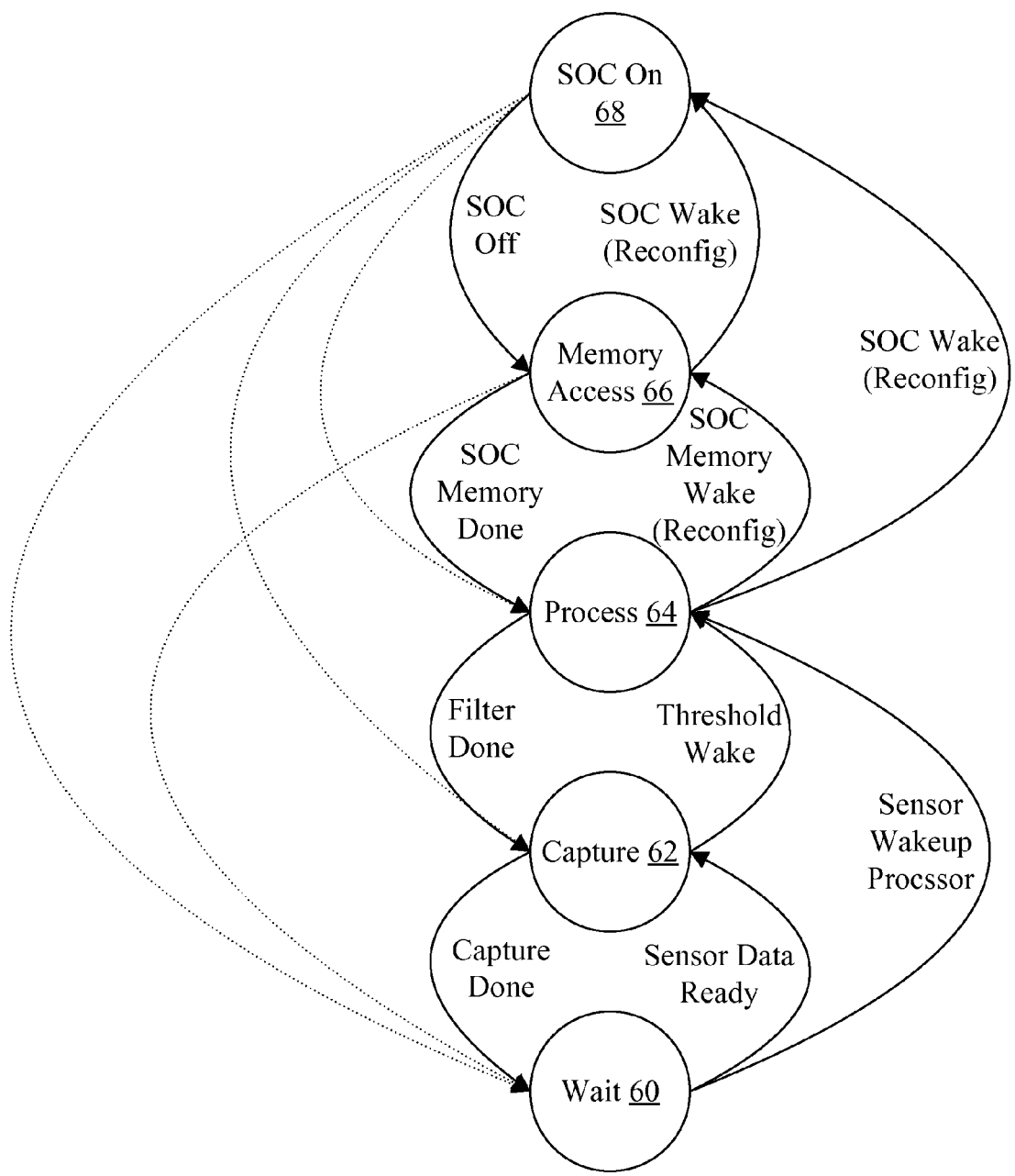
FIG. 3 is a block diagram of one embodiment of a state machine for the always-on block shown in FIG. 2.

Turning now to FIG. 3, a block diagram of one embodiment of a state machine that may be implemented in one embodiment of the always-on component 16 is shown. In the illustrated embodiment, the states include a wait state 60, a capture state 62, a process state 64, a memory access state 66, and an SOC on state 68. Transitions between the states are illustrated with solid lines, and certain additional possible transitions are indicated with dotted lines. Not all possible transitions are illustrated in FIG. 3 to avoid obscuring the drawing.

The states illustrated in FIG. 3 may be in order of relative power/energy consumption, with the wait state 60 being the lowest-power state and the SOC on state 68 being the highest-power state. In the wait state 60, the subcomponents of the always-on component 16 may be either power gated or clock gated. For example, in an embodiment, the processor 40 may be power gated and the SCM 44 may be clock-gated. The memory 42 may be in retention mode or may be powered normally. The SOC reconfiguration circuit 46 and the local PMGR 48 maybe clock gated. Any combination of clock gating and power gating may be used among the subcomponents.

In the wait state 60, the always-on component 16 may be essentially idle. The state machine may transition from the wait state 60 to the capture state 62 when sensor data is ready to be captured by the SCM 44 from the sensors 20. In one embodiment, a timer (e.g. a watchdog timer) within the always-on component 16 (not expressly shown in FIG. 2) may periodically cause the transition from the wait state 60 to the capture state 62. There may or may not be sensor data to capture in this case. In one embodiment, the sensors may assert a signal to the always-on component 16 to indicate that sensor data is available for capture. In either case, the transition to the capture state 62 may be performed.

In the illustrated embodiment, the state machine may also transition directly from the wait state 60 to the process state 64. This transition may be supported if a sensor is configured to signal the always-on component 16 that processor support (from the processor 40) is desired. The signal may be separate from the signal to indicate that sensor data is available, for embodiments that implement the signal. The transition may support rapid processing of the sensor data (e.g. filtering) for example, or may be used if a rapid wakeup of the SOC 10 is desired (which may be managed by software executing on the processor 40). For example, a button or other user interface device that indicates a user's desire to interact with the device may be an event that would cause rapid wakeup of the SOC 10. If the processor 40 is power gated in the wait state 60, the transition from the wait state 60 to the process state 64 may include powering up the processor 40, and resetting and initializing the processor 40. In other embodiments, the transition from the wait state 60 may pass through the capture state 62, but not remain in the capture state 62. This implementation may reduce complexity with a slightly longer wakeup time for the processor 40.

In the capture state 62, the SCM 44 may be active and may be sampling data from one or more of the sensors 20. The SCM 44 may write the captured sensor data to memory 42 (SCM data 52). The SCM 44 may also write additional data to the memory 42 (SCM data 52), such as a timestamp associated with the captured sensor data, a sensor identifier, etc. Any desired additional data may be stored in the memory 42. In one embodiment, the timestamp may be the time at which the sensor data was sensed by the sensor 20, which may be before the data is captured by the SCM 44. Alternatively, the timestamp may be the time of the sensor data capture by the SCM 44.

The SCM 44 may detect one or more thresholds at which the SCM 44 may be configured to wake the processor 40 to process the data. The thresholds may include, e.g., a relative fullness of the SCM data 52 in the memory 42, a number of sensor samples taken, an elapsed time since the first sample, a wakeup timer that is not triggered by samples, an error detection, etc. Any set of one or more thresholds may be used, and different thresholds may be used for different sensors. If the threshold is reached, the state machine may transition from the capture state 62 to the process state 64. Alternatively, if the sensor data capture is complete, the state machine may transition from the capture state 62 to the wait state 60.

In the process state 64, the processor 40 may be active and executing code from the memory 42 (or out of the processor 40's cache, if any). The code may include, e.g., filter code. During the process state 64, the SCM 44 may be periodically active to capture additional sensor data, or may be active continuously in the process state 64. The code executing on the processor 40 may determine that it has completed, at least temporarily, and may cause a transition back to the capture state 62. Alternatively, the transition may be directly to the wait state 60 (e.g. if the SCM 44 is inactive).

The code may also determine that communication with the memory 12 is desired in the process state 64. For example, communication with memory 12 may be used to write captured sensor data from the memory 42 to the memory 12, to make use of the larger available storage space in the memory 12. In some embodiments, the memory 12 may also store additional code executable by the processor 40 (e.g. additional filtering algorithms) that may not be continuously stored in the memory 42. The additional code may be executed by the processor 40 after communication with the memory 12 is established. For example, the additional code may be fetched from the memory 12 into the memory 42 and/or may be cached by the processor 40. The data may be written from the memory 42 to the memory 12 responsive to the processor 40 detecting a desired pattern or other aspect in the captured sensor data, and additional processing by the CPU processors 30 in the CPU complex 14 may be warranted. The data may be written to the memory 12 so that the CPU processors 30 have access to it. If communication with the memory 12 is desired, the state machine may transition to the memory access state 66. The transition may include operation by the SOC reconfiguration circuit 46 to program the state of the memory controller 22 as well as a communication path from the always-on component 16 to the memory controller 22. In some embodiments, the entire communication fabric 27 may be activated. In other embodiments, only the portion of the communication fabric 27 that is involved in communication between the memory controller 22 and the always-on component 16 may be activated. The memory 12 may also be brought out of self refresh. In an embodiment, the local PMGR 48 may also be involved in the transition, requesting power up of the memory controller 22 if the memory controller supply voltage is managed by the PMU 156.

In the memory access state 66, the memory controller 22 may be active and the always-on component 16 may have access to the memory 12. The always-on component 16 (and more particularly the processor 40, in an embodiment) may be configured to generate read and write operations to the memory 12, which may be carried over the interconnect 50 and the communication fabric 27 to the memory controller 22. Data may be returned by the memory controller 22 (for reads) or received by the memory controller 22 (for writes) in a similar fashion.

The processor 40 may determine that the need to access the memory 12 has ended, and may cause a transition back to the process state 64. The transition may include returning the memory 12 to self refresh mode and powering down the memory controller 22 and the communication fabric 27.

The processor 40 may also determine that the SOC 10 is to be awakened (e.g. to handoff processing to the CPU complex 14). The state machine may transition from the memory access state 66 to the SOC on state 68. The transition may include the local PMGR 48 requesting power up for the SOC 10 from the PMU 156 and may include the SOC reconfiguration circuit 46 programming various components from the configuration data 56. In one embodiment, a transition directly from the process state 64 to the SOC on state 68 may be supported. In such a transition, power up of the memory controller 22 and removal of the memory 12 from self refresh may be performed as well. Alternatively, the processor 40 may detect a desire to transition to the SOC on state 68 but may pass through the memory access state 66 to perform the transition.

From the SOC on state 68, the SOC 10 (e.g. the PMGR 32 and/or the software executing on the CPU processors 30) may determine that the SOC 10 is to transition to a lower power state. In one embodiment, the software may perform a "suspend to RAM" operation in which various system state, including the state also represented by the configuration data 56, is written to the memory 12 before the memory 12 is placed in self refresh and the SOC 10 components are powered down. Thus, upon return to the SOC on state 68, the reprogramming of state from the configuration data 56 may be performed and then the software may resume execution based on the data stored in the memory 12. The transition may be relatively quick, e.g. as compared to if the always-on component 16 were not included. In such a case, software may begin the normal cold boot process. At some point in the process, the software may recognize that the suspend to RAM had occurred, but some unnecessary initialization processing may have already been performed at that point in the process.

Generally, operations performed in lower power states may also be performed while the state machine is any of the higher power states as well. For example, sensor data capture may also be performed while the state machine is in the process state 64, the memory access state 66, and the SOC on state 68 (e.g. if one of the triggers that causes the SCM 44 to capture data occurs while the state machine is any of the other states). Similarly, the processor 40 may be active an any of the process state 64, the memory access state 66, and the SOC on state 68 and thus may process data in any of these states.

If the SOC 10 shuts down, the state machine may return from the SOC on state 68 to the memory access state 66 (and may transition to lower states based on other activity in the always-on component 16). Alternatively, a transition from the SOC on state 68 directly to any of the states 60, 62, 64, or 66 may be performed based on the current activity in the always-on component 16 at the time the transition occurs.

Figure 4:
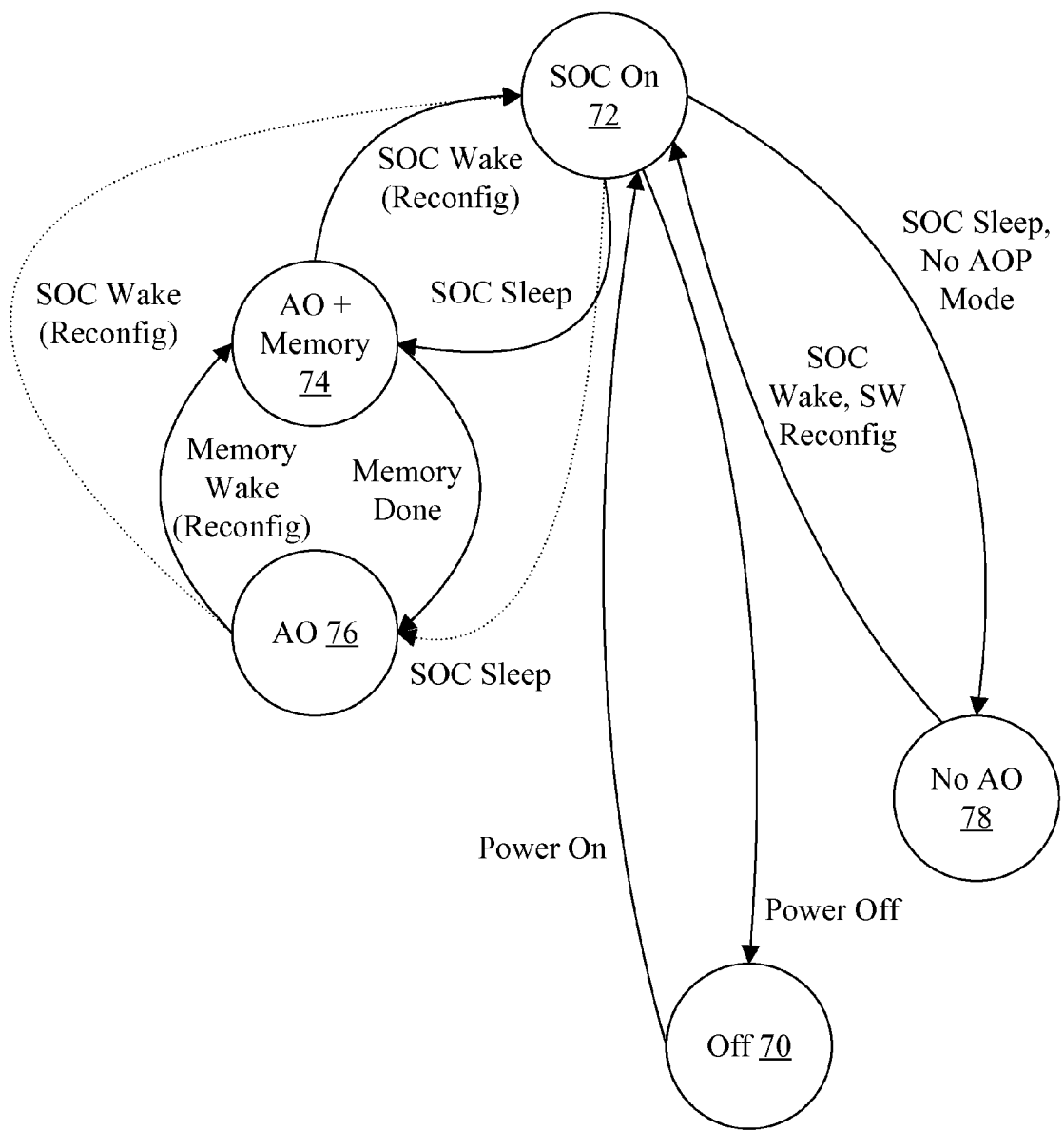
FIG. 4 is a block diagram of another embodiment of a state machine for the always-on block shown in FIG. 2.

Turning now to FIG. 4, a block diagram of another state machine is shown. The state machine in FIG. 4 may be implemented in concert with the state machine of FIG. 3. In the illustrated embodiment, the state machine includes an off state 70, on SOC On state 72, an AO+memory state 74, an AO state 76, and a No AO state 78. AO in this context may be an acronym for always-on.

The off state 70 may be the state in which all power to the SOC 10 is off, such as when the device including the SOC 10 is completely off. Accordingly, the state machine may transition from the off state 70 (e.g. to the SOC On state 72) in response to the power being turned on to the SOC 10. A reset of the SOC 10 may be performed, and then the SOC 10 may proceed to boot. The state machine may transition from the SOC On state 72 to the off state 70 in response to powering off the SOC 10 completely. The power off may occur after software executing on the CPUs 30 has saved any desired state from memory 12 to non-volatile memory, closed down various connections that the device may have (e.g. wireless and/or wired network connections, wireless phone connections, etc.), and otherwise have prepared the device for an orderly shutdown. While the transition is from the SOC On state 72 to the off state 70 in FIG. 4, transitions from the other states to the off state 70 may be supported in other embodiments.

In the SOC On state 72, the SOC 10 may be in full operation. Various components of the SOC 10 may be powered on or powered off as desired, but the SOC 10 as a whole may generally be viewed as active in the SOC On state 72. The SOC On state 72 may correspond to the SOC On state 68 in the embodiment of FIG. 3.

In the SOC On state 72, the software executing on the CPU complex 14 may determine that the SOC 10 should go to a low power state (e.g. sleep). In an embodiment, the software may perform a "suspend to RAM" operation, in which various SOC state is written to the memory 12 prior to powering down the SOC 10. The memory 12 may be placed in a "self refresh" mode in which it maintains the memory contents but is not active on the memory interface to the memory controller 22. The PMGR 32 may communicate power down commands to the PMU 156 to cause the power down of the components in the SOC 10 other than the memory controller 22, the fabric 27 (or portion thereof that is used to communicate between the memory controller 22), and the always-on component 16. Alternatively, the local PMGR 48 may transmit the power down commands. The state machine may transition to the AO+memory state 74. In some embodiments, a transition from the SOC On state 72 to the AO state 76 may be supported as well. Alternatively, the transition from the SOC On state 72 to the AO state 76 may pass through the AO+memory state 74. That is, if the target state is the AO state 76, the transition to the AO+memory state 74 may be made, followed by the transition to the AO state 76.

In the AO+memory state 74, the memory controller 22, the communication fabric 27 (or the portion to the always-on component 16) and the always on component 16 may be active. The AO+memory state 74 may correspond to the memory access state 66 in FIG. 3. If an event that causes the SOC to wake up is detected, the state machine may transition to the SOC On state 72 (powering up the other components of the SOC 10 via communication with the PMU 156 and/or power switches in the SOC 10 and reconfiguring the components via the SOC reconfiguration circuit 46 and/or from data in the memory 12, in various embodiments).

On the other hand, the always-on component 16 may determine that memory access is completed and may deactivate the memory controller 22 (after placing the memory 12 in a retention mode such as self-refresh). The memory controller 22 may be powered down and the always-on component 16 may remain powered. The state machine may transition to the AO state 76. The AO state 76 may correspond to any of the process state 64, the capture state 62, and the wait state 60 in FIG. 3. If the always-on component 16 determines that memory access is desirable again (e.g. due to reaching various thresholds in the SCM data 52 or detecting patterns/attributes via the processor 40), the state machine may transition to AO+memory state 74 (powering the memory controller 22 and the communication fabric 27 and reconfiguring the same via the SOC reconfiguration circuit 46). In some embodiments, a direct transition from the AO state 76 to the SOC On state 72 may be supported, including powering up the memory controller 22, the communication fabric 27, and other components of the SOC 10 and reconfiguring those components via the SOC reconfiguration circuit 46.

In one embodiment, the No AO state 78 may be supported. The No AO state 78 may be a state in which the always-on component 16 is powered down but the memory 12 remains powered in retention mode. The No AO state 78 may be similar to a "classic" suspend to RAM state. Returning from the No AO state 78 to the SOC On state 72 may include software reconfiguring the components of the SOC 10, including the always-on component 16. The software may execute on the CPU processors 30. Thus, the transition from the no AO state 78 to the SOC On state 72 may include basic boot operations until software has initialized the SOC 10 and has detected that memory 12 is storing state already.

Figure 5:
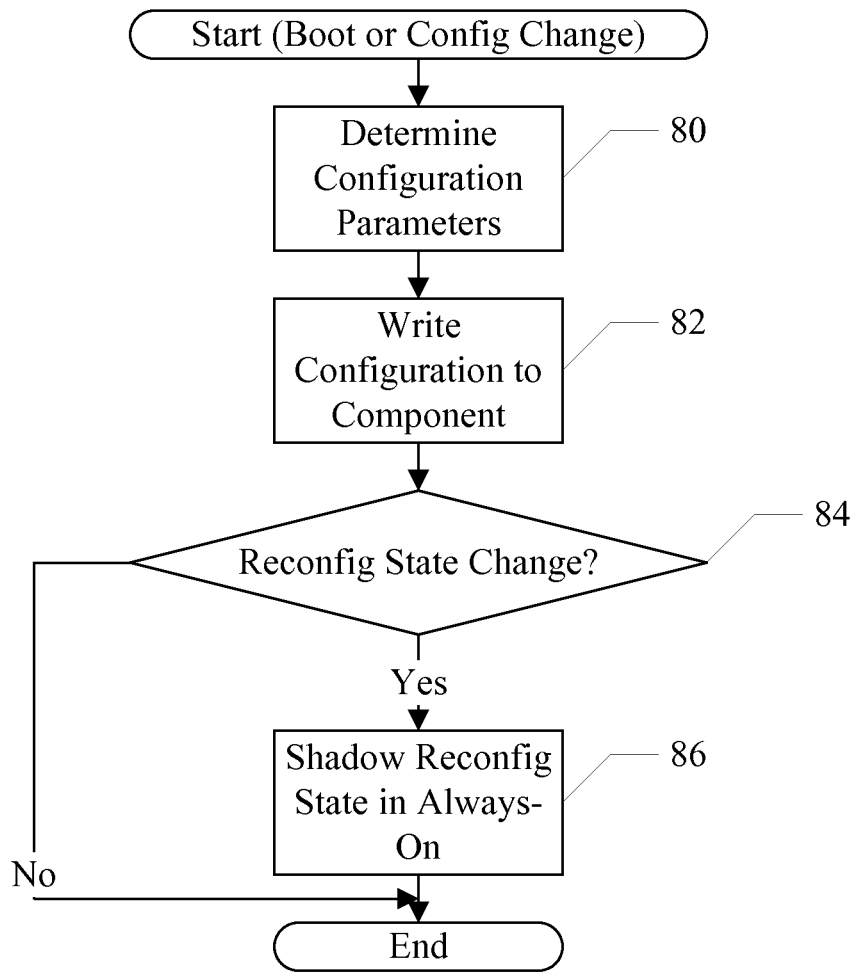
FIG. 5 is a flowchart illustrating operation of one embodiment of software executing on a CPU in the SOC during boot or configuration change.

Turning next to FIG. 5, a flowchart is shown illustrating operation of one embodiment of software code that may be executed on the SOC 10 (e.g. by the CPU processors 30). The code may be executed at boot of a device that includes the SOC 10. The code may similarly be executed during a change in programmable configuration of a component. The code executing during a configuration change may or may not be the same code that is executed during boot, in various embodiments. In other embodiments, portions of the operation shown in FIG. 5 may be implemented in hardware. The code may include instructions which, when executed on a processor, implement the operation illustrated in FIG. 5. In an embodiment, the code implementing the operation shown in FIG. 5 may be part of the driver code for a corresponding component, and thus the operation illustrated in FIG. 5 may be implemented in multiple code sequences.

The code may determine the configuration parameters to be programmed into the component (block 80). The parameters maybe based on discovering the component and its capabilities. While components in the SOC 10 may be fixed because they are implemented in hardware, the code may be general purpose to run on multiple versions of the SOC 10. Furthermore, the SOC 10 may be included in multiple, differently-designed devices. The desired parameters may be affected by the particular device in which the SOC 10 is instantiated.

The code may write the configuration parameters to the component (block 82), programming the component. If the configuration parameters include data that is to be restored upon repowering the SOC 10 after a sleep state or other power down state (decision block 84, "yes" leg), the code may write the configuration parameters to the programmable configuration data 56, thus shadowing the state in the SOC reconfiguration circuit 46 (block 86). In other embodiments, the SOC reconfiguration circuit 46 may be configured to automatically shadow the desired state.

It is noted that, in some embodiments, not all of the configuration parameters need be part of the reconfiguration state that is restored to the component on a subsequent power up of the SOC 10. For example, parameters that set various optional features which are not required for basic communication with the component may be set to default values on reconfiguration. Such optional parameters may be read from the suspend to RAM state in the memory 12 after restarting execution on the CPUs 30 for restore to the component. Accordingly, such parameters need not be part of the state stored by the SOC reconfiguration circuit 46. Furthermore, as mentioned previously, in some embodiments the parameters written to the SOC reconfiguration circuit 46 may differ from those programmed into the component at the time the SOC 10 is powered down. In such a case, the parameters written to the SOC reconfiguration circuit 46 may be those that are to be reprogrammed into the component in response to a wakeup of the SOC 10.

Figure 6:
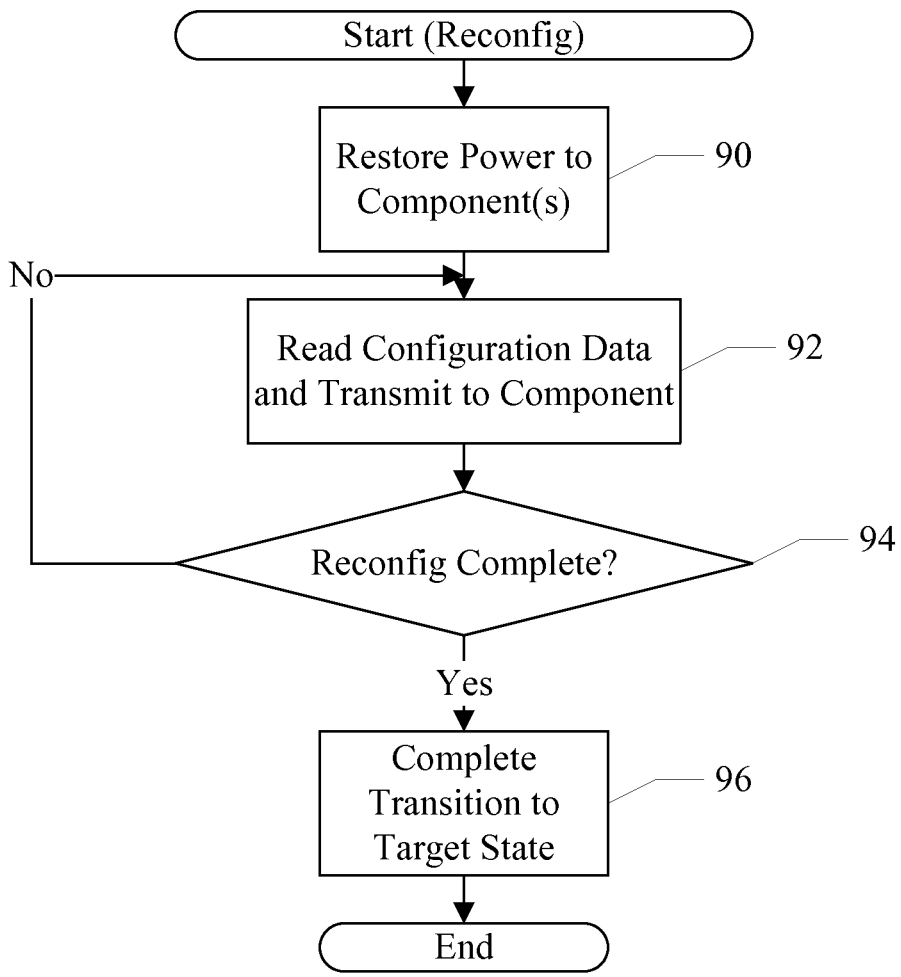
FIG. 6 is a flowchart illustrating operation of one embodiment of the always-on block shown in FIG. 2 during reconfiguration.

Turning next to FIG. 6, a flowchart is shown illustrating operation of one embodiment of the always-on component 16 in response to a determination in the always-on component 16 that one or more components of the SOC 10 are to be powered up again. For example, the operation of FIG. 6 may be part of the transition to the memory access state 66/AO+memory state 74, to restore the memory controller 22 and the communication fabric 27. The operation of FIG. 6 may be part of the transition to the SOC On state 68/SOC On state 72, to restore components throughout the SOC 10. The always-on component 16 may be configured to implement the operation shown in FIG. 6.

The always-on component 16 may be configured to cause a restore of the power of the components being powered up (block 90). For example, the local PMGR 48 may be configured to request that the PMU 156 restore supply voltage to one or more supply voltage rails of the SOC 10. Alternatively, the local PMGR 48 or other circuitry in the always-on component 16 may be configured to control power switches in the SOC 10 to restore power to power gated components. A combination of PMU requests and power switch controls may be used as well.

Once power has stabilized and any component reset has been completed, the SOC reconfiguration circuit 46 may be configured to program the components with the programmable configuration data 56 that corresponds to the component (block 92). The SOC reconfiguration circuit 46 may be configured to read the programmable configuration data 56 and transmit the data to the component, until the reconfiguration is complete (decision block 94). Once the reconfiguration has completed (decision block 94, "yes" leg), the transition to the new state (e.g. the memory access state 66 or the SOC On state 68) may be completed (block 96).

The transmission may take any form (e.g. programmed input/output (PIO) writes, dedicated communication paths, memory-mapped I/O writes, etc.). In addition to the writes of configuration parameters, some embodiments may support other information in the programmable reconfiguration data 56 to determine status from a component, which may form part of the determination of whether or not reconfiguration is complete (decision block 94). For example, a series of configuration parameter writes may be transmitted to a component, followed by a polling read to a register that the component updates to indicate completion or readiness to operate, for example.

Figure 7:
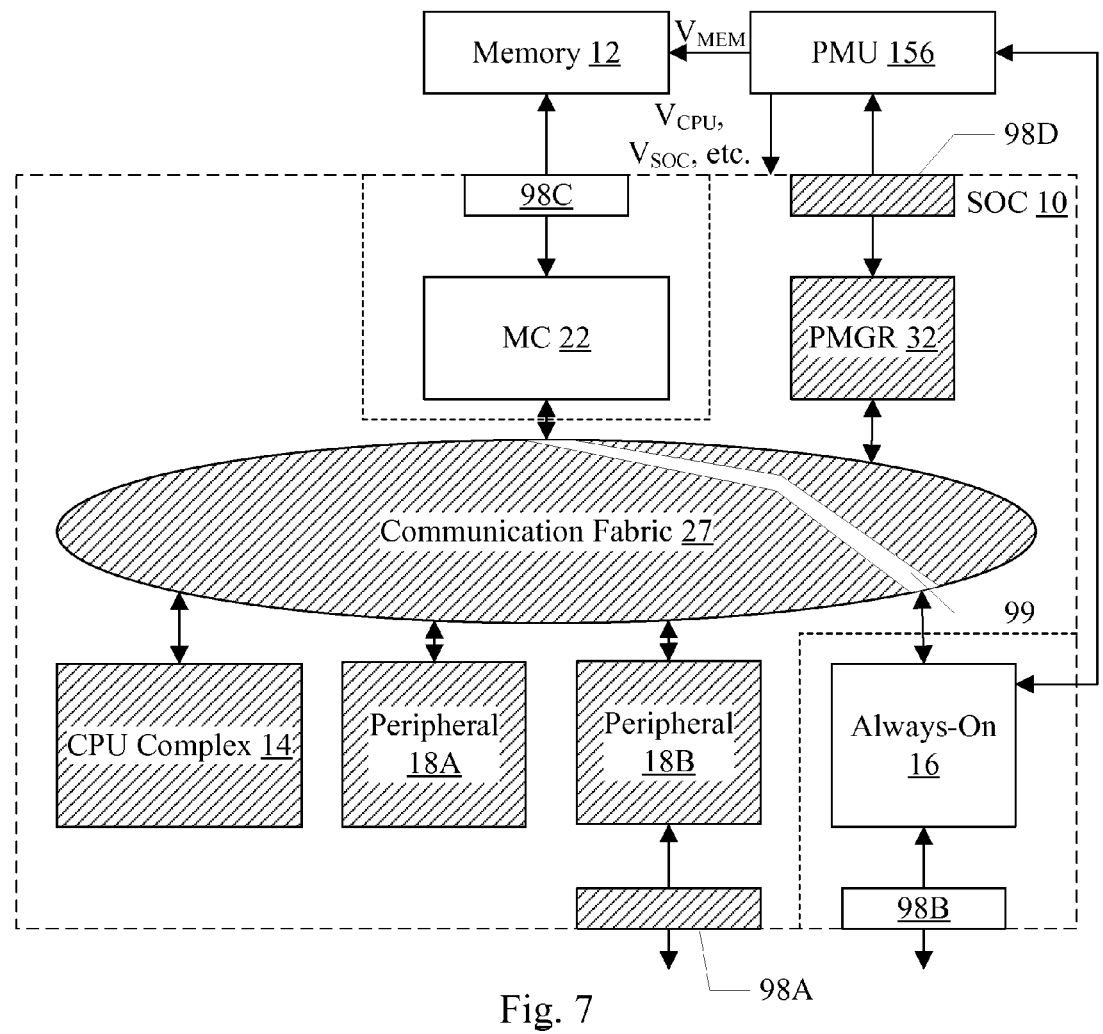
FIG. 7 is a block diagram illustrating of one embodiment of the SOC in a memory-only communication state.

FIG. 7 is a block diagram illustrating the components of the SOC 10 and which components are on or off in one embodiment of the SOC 10 for memory access state 66/AO+ memory state 74. The crosshatched components in FIG. 7 are powered off, while the non-crosshatched components are powered on. Also illustrated in FIG. 7 are various pads 98A-98D. The pads may include input/output driver/receiver circuitry configured to drive signals on pins of the SOC 10 and receive signals from the pins. Accordingly, the pads 98A-98D may receive supply voltages as well. In this embodiment, the pads 98C for the memory controller 22 to communicate with the memory 12 may be powered on, as may the pads 98B from the always-on component 16 to various sensors. Pads 98D for the PMGR 32 to communicate to the PMU 156, and the pads 98A for the peripheral 18B, may both be powered down. Alternatively, a single pad structure may be used in which all pads are powered on whenever at least one pad is powered on.

As illustrated in FIG. 7, the memory controller 22 and the always-on component 16 may be powered up while the remaining components are powered down. Additionally, a portion 99 of the communication fabric 27 that is used to communicate between the always-on component 16 and the memory controller 22 may be powered up while the remainder of the communication fabric 27 may be powered down. For example, in an embodiment, the communication fabric 27 may include a hierarchical set of buses and circuitry to route transactions from sources such as the peripherals 18A-18B, the CPU complex 14, and the always-on component 16 to the memory controller 22. The fabric may also carry data (to the memory controller 22 for writes, from the memory controller 22 for reads) and responses from the memory controller 22 to the sources. The portions of the hierarchical interface and circuitry between the always-on component 16 and the memory controller 22 may be powered on and other portions may be powered off.

Figure 8:
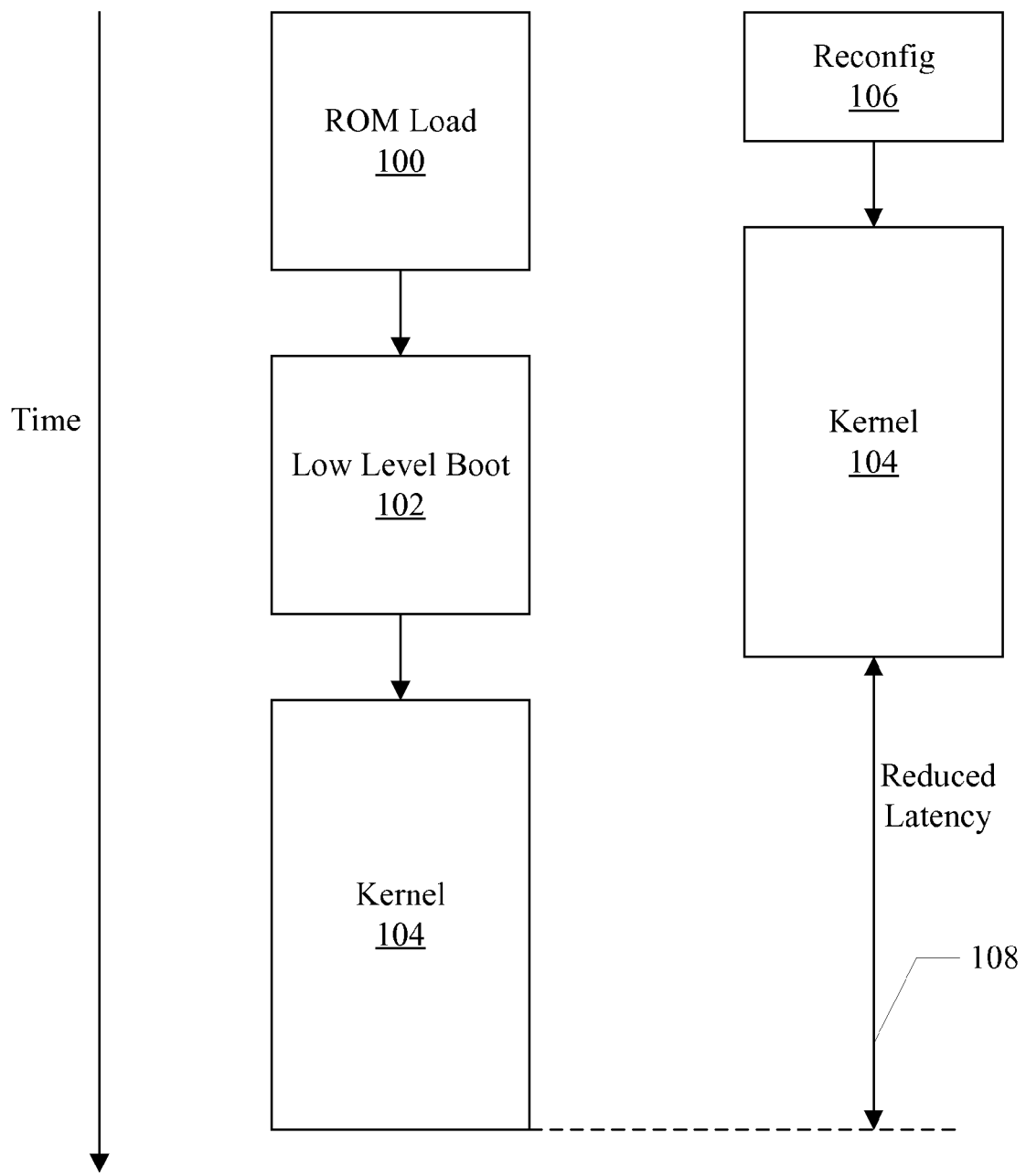
FIG. 8 is a block diagram illustrating latency reduction for one embodiment using the reconfiguration approach.

FIG. 8 is a block diagram illustrating latency reduction using the reconfiguration mechanism, for one embodiment. Time increases from top to bottom in FIG. 8, as illustrated by the arrow on the left hand side of FIG. 8. To the left is a boot sequence for the integrated circuit 10, and to the right is a reconfiguration according to the reconfiguration mechanism of the present implementation.

The boot sequence may be performed when a device including the SOC 10 is powered up initially. Accordingly, there is no data stored in the memory 12 and the SOC 10 is not initialized, including the programmable reconfiguration data 56. The boot sequence includes a read-only memory (ROM) load 100, a low level boot 102, and a kernel 104. The ROM load 100 may begin at the exit of reset by the CPU processors 30 and may include reading low level boot code for the low level boot 102 from a ROM (e.g. a secure ROM), decrypting and/or authenticating the low level boot code, and starting the low level boot code. The low level boot code may discover the various components of the SOC 10 and may initialize the components. Generally, the amount of initialization, the components to be initialized, and the state to which the components are initialized by the low level boot code may be controlled according to the design of the kernel code (kernel block 104). That is, the low level boot code may generate a state in the system/SOC 10 that is expected to be in place when the kernel code executes its first instruction. The kernel code may be the central core of the operating system, managing the SOC 10's resources for use by various application programs executing in the system.

When powering up again using the reconfiguration mechanism, the ROM load 100 may be avoided. The reconfiguration mechanism (block 106) may have the same effect as the low level boot 102, but may in some cases be more rapid than the low level boot code. At worst, the reconfiguration mechanism 106 may have the same latency as the low level boot 102. At the conclusion of the reconfiguration mechanism 106, the kernel 104 may be ready to execute. The latency reduction using the reconfiguration mechanism is indicated by the arrow 108.

In another embodiment, the reconfiguration mechanism 106 may be implemented by deriving reconfiguration code from the low level boot code and storing the code in a location accessible by the CPU processors 30 after the power up event (e.g. in a non-volatile memory such as Flash memory in the SOC 10 or coupled thereto). After powering up and resetting the CPU processors 30, the CPU processors 30 may be released from reset to a reset vector that points the location so that the reconfiguration code may be executed. The reconfiguration code may terminate with a call to the kernel.

Figure 9:
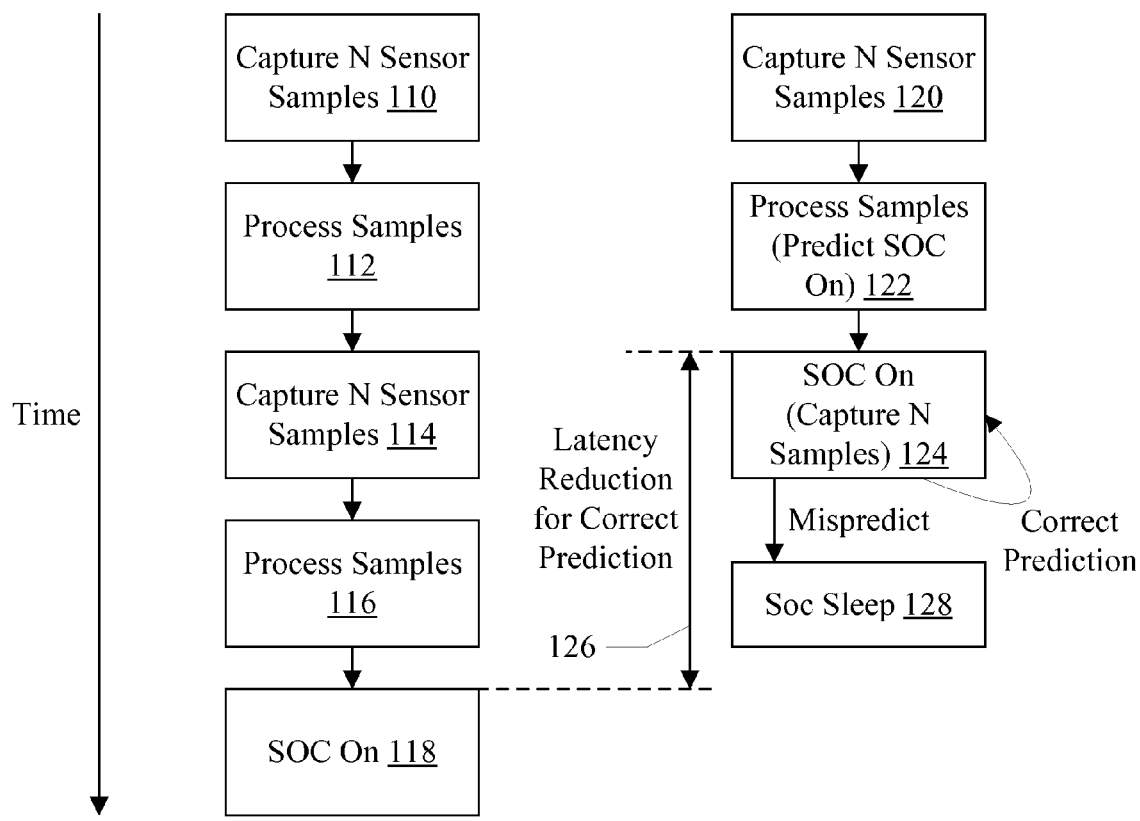
FIG. 9 is a block diagram illustrating one embodiment of speculative wake up for latency reduction.

FIG. 9 is a block diagram illustrating the use of speculation to reduce wakeup latency, for one embodiment. Generally, speculation such as that shown in FIG. 9 may be used at any level (e.g. any transition between states in FIGS. 3 and 4) to reduce latency. While some power may be consumed in powering up circuitry speculatively and powering it back down if the speculation is incorrect, a reasonably accurate speculation may be a good power/performance tradeoff. Similar to FIG. 8, time increases from top to bottom in FIG. 9.

On the left in FIG. 9 is a sequence performed without speculation. The always-on component 16 may collect N sensor samples (block 110). That is, the always-on component 16 may transition N times between the wait state 60 and the capture state 62, capturing sensor data each time (where N is a positive integer). The always-on component 16 may be programmed with a threshold of N in this example, so that after the N sensor samples, the state machine transitions to the process state 64 (waking the processor 40). The processor 40 may process the sensor data (block 112), but not detect a pattern or other attribute of the sensor data that causes the processor 40 to wake the memory controller 22 or other parts of the SOC 10. The state machine may return to the capture state 62 and/or the wait state 60. Subsequently, N more sensor samples may be collected (block 114), and the processor 40 may again be awakened and may process the sensor data (block 116). In this case, the processor 40 may detect that the SOC 10 is to be awakened so that the CPU processors 30 may further process the sensor data or perform other processing. Thus, the state machine may transition to the SOC On state 68/72, awakening the SOC 10 and permitting the processing (block 118).

On the right in FIG. 9 is an example of speculation to reduce the latency for turning on the SOC 10. Similar to the example on the left, the example on the right may include the always-on component 16 collecting N sensor samples and waking the processor 40 (block 120), transitioning the state machine to the process state 64. In this case, however, the code executed by the processor 40 not only searches for patterns/attributes in the sensor data that indicate the desire for immediate SOC processing (e.g. similar to blocks 112 and 116 on the left side of FIG. 9), but also searches for patterns/attributes to predict that SOC processing will be desired soon. In the example on the right, the code executed by the processor 40 may predict that the SOC processing in desired (block 122), and may cause the state machines to transition to the SOC On state 68/72 (block 124). The SCM 44 may continue to capture sensor samples in parallel as well. When the pattern/attribute is detected that would cause the wakeup, the SOC 10 may already be ready. Latency may be reduced as compared to the example on the left, illustrated by the arrow 126. If the prediction is incorrect (mispredict in FIG. 9, the SOC 10 may return to sleep (block 128). In this case, the power used to wake up the SOC 10 may have been wasted.

Figure 10:
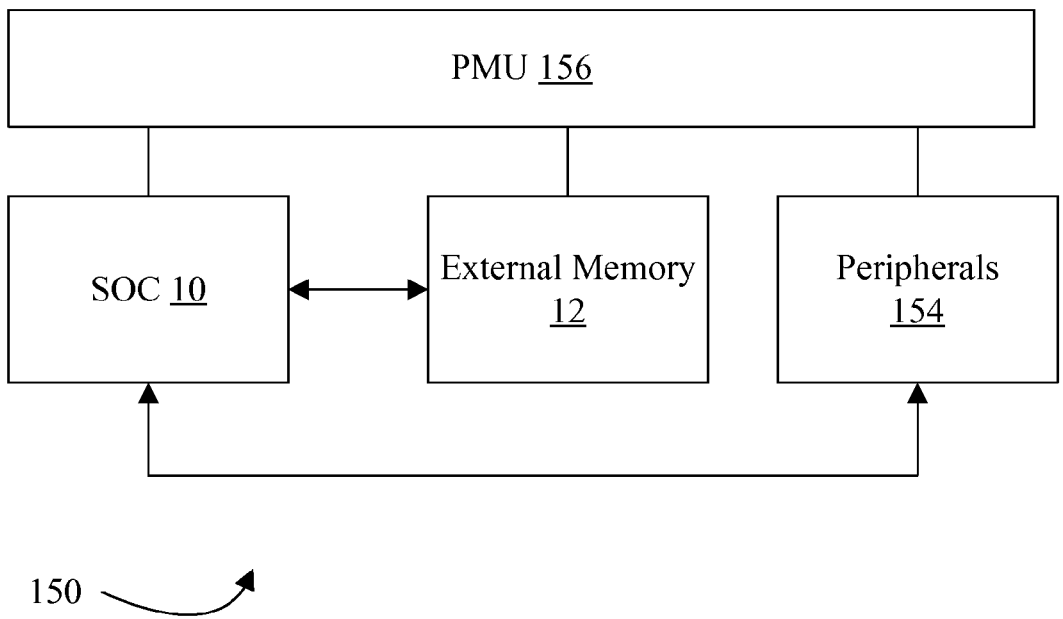
FIG. 10 is a block diagram of one embodiment of a system including the SOC shown in FIG. 1.

Turning next to FIG. 10, a block diagram of one embodiment of a system 150 is shown. In the illustrated embodiment, the system 150 includes at least one instance of the SOC 10 coupled to one or more peripherals 154 and the external memory 12. The PMU 156 is provided which supplies the supply voltages to the SOC 10 as well as one or more supply voltages to the memory 12 and/or the peripherals 154. In some embodiments, more than one instance of the SOC 10 may be included (and more than one memory 12 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In the embodiment of FIG. 1, the peripherals 154 may include the sensors 20. In other embodiments, the system 150 may be any type of computing system (e.g. desktop personal computer, laptop, workstation, net top etc.).

The external memory 12 may include any type of memory. For example, the external memory 12 may be SRAM, dynamic RAM (DRAM) such as synchronous DRAM (SDRAM), double data rate (DDR, DDR2, DDR3, etc.) SDRAM, RAMBUS DRAM, low power versions of the DDR DRAM (e.g. LPDDR, mDDR, etc.), etc. The external memory 12 may include one or more memory modules to which the memory devices are mounted, such as single inline memory modules (SIMMs), dual inline memory modules (DIMMs), etc. Alternatively, the external memory 12 may include one or more memory devices that are mounted on the SOC 10 in a chip-on-chip or package-on-package implementation.

Figure 11:
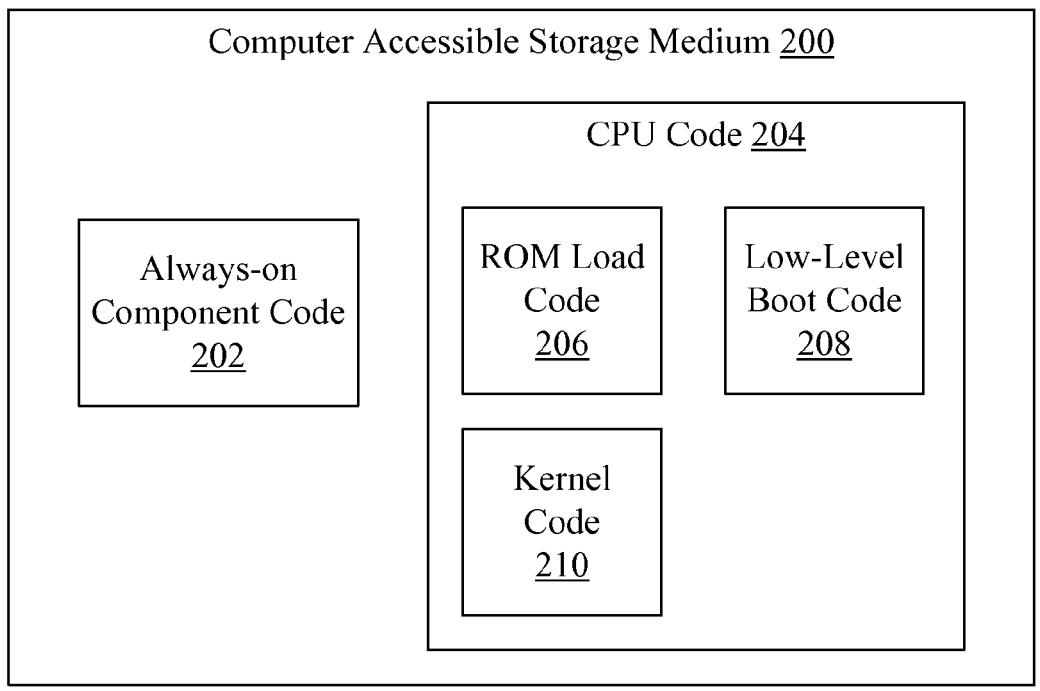
FIG. 11 is a block diagram of one embodiment of a computer accessible storage medium.

FIG. 11 is a block diagram of one embodiment of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 200 may store data in a non-transitory manner, where non-transitory in this context may refer to not transmitting the instructions/data on a signal. For example, non-transitory storage may be volatile (and may lose the stored instructions/data in response to a power down) or non-volatile.

The computer accessible storage medium 200 in FIG. 11 may store always-on component code 202. The always-on component code 202 may include instructions which, when executed by the processor 40, implement the operation described for the code above. The always-on component code 202 may include the processor code 54 shown in FIG. 2, for example. The computer accessible storage medium 200 in FIG. 11 may further include CPU code 204. The CPU code 204 may include ROM load code 206, low level boot code 208, and/or kernel code 210. Each code may include the instructions which, when executed, implement the operations assigned to the ROM load block 100, the low-level boot block 102, and the kernel block 104, for example. A carrier medium may include computer accessible storage media as well as transmission media such as wired or wireless transmission.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
  at least one processor forming a central processing unit in the integrated circuit;
  a power management circuit configured to transmit voltage requests to an external power management unit to supply one or more voltages to the integrated circuit, wherein the external power management unit is external to the integrated circuit;
  a memory controller coupled to a memory during use, wherein the power management circuit is configured to cause a power down of the memory controller via communication to the external power management unit; and a first component coupled to the processor and the memory controller, wherein the first component is configured to remain powered while the processor, the power management circuit, and the memory controller are powered off, and wherein the first component is coupled to the external power management unit separate from the power management circuit and is configured to cause the memory controller to power up via communication to the external power management unit that is separate from the power management circuit, to program the memory controller using memory controller configuration data stored in the first component, and to communicate with the memory controller during a time that the processor is powered down.

2. The integrated circuit as recited in claim 1 wherein the memory controller configuration data represents a programmed configuration of the memory controller at a time that the memory controller was powered down.

3. The integrated circuit as recited in claim 2 wherein the processor is configured to program the memory controller responsive to executing a plurality of instructions, and wherein the processor is further configured to write the memory controller configuration data to the first component responsive to executing the plurality of instructions.

4. The integrated circuit as recited in claim 2 further comprising a plurality of components, wherein the first component is further configured to store configuration data representing the programmed configuration of each of the plurality of components at the time the plurality of components were powered down.

5. The integrated circuit as recited in claim 4 wherein the first component is configured to program each of the plurality of components with the stored configuration data responsive to each of the plurality of components powering up.

6. The integrated circuit as recited in claim 5 wherein the processor is configured to execute operating system software, and wherein the first component is configured to program the memory controller and the plurality of components prior to the operating system resuming execution on the processor.

7. A method comprising:

booting a system including a system on a chip (SOC) that comprises at least one processor forming a central processing unit (CPU) of the system, a memory controller, a power management circuit, and a plurality of components, wherein the booting comprises initializing the memory controller and the plurality of components, and wherein the plurality of components includes a first component configured to remain powered when a remainder of the SOC is powered down;

writing configuration data representing a programmed configuration of the plurality of components and the memory controller to the first component;

powering down the memory controller, the plurality of components, the power management circuit, and the processor via requests transmitted by the power management circuit to an external power management unit, wherein the external power management unit is external to the SOC;

powering the memory controller up again subsequent to the powering down, wherein the first component causes the powering up again via communications to the external power management unit, the communications from the first component separate from the communications from the power management circuit; and reinitializing the memory controller with the configuration data from the first component.

8. The method as recited in claim 7 further comprising:

keeping the plurality of components and the processor powered down during the powering up again and the reinitializing; and the first component communicating with the memory controller subsequent to the reinitializing while the plurality of components and the processor remain powered down.

9. The method as recited in claim 8 further comprising the first component determining that communication with the memory controller is needed, wherein the powering up again is responsive to the determining.

10. The method as recited in claim 7 further comprising:

powering up the plurality of components and the processor; and reinitializing the plurality of components and the processor with the configuration data from the first component.

11. The method as recited in claim 10 further comprising the processor executing operating system software, wherein the reinitializing of the plurality of components is performed prior to the processor beginning execution of the operating system software.

12. The method as recited in claim 11 wherein the booting is performed, at least in part, by executing operating system software on the processor, and wherein writing the configuration data is further performed by executing the operating system software on the processor.

13. The method as recited in claim 10 further comprising the first component determining that powering up the plurality of components and the processor is needed, wherein the powering up is responsive to the determining.

14. The method as recited in claim 7 further comprising:

changing the programmed configuration of the memory controller during operation; and updating the configuration data in the first component to reflect the changed configuration.

15. The method as recited in claim 7 further comprising writing a state of the system to the memory to which the memory controller is coupled prior to powering down the memory controller, the plurality of components, and the processor.

16. A system comprising:

a memory; and a power management unit;

a system on a chip (SOC) coupled to the memory and the power management unit, wherein the power management unit is external to the SOC, the SOC including a memory controller configured to interface to the memory, and the SOC further including at least one processor forming a central processing unit (CPU) of the system, and the SOC still further including a power management circuit configured to request voltages for the SOC from the power management unit, and the SOC still further including a first component configured to remain powered at a time that the processor and the memory controller are powered down, wherein the processor and the memory controller are powered down responsive to the power management circuit, wherein the first component is coupled to the power management unit separate from the power management circuit and is configured to cause the memory controller to be powered up via communications to the power management unit separate from the power management circuit, and wherein the first component is configured to restore a state of the memory controller using configuration data stored in the first component in order to communicate to the memory during the time that the processor is powered down.

17. The system as recited in claim 16 wherein the SOC further comprises a plurality of components that have a programmable state, wherein the configuration data further includes data to restore the programmable state of the plurality of components and to restore the programmable state of the plurality of components responsive to powering the plurality of components.

18. The system as recited in claim 17 wherein the processor is configured to execute operating system software during use, wherein the processor is configured to initialize the state of the memory controller and the programmable state of the plurality of components, and wherein the first component is configured to restore the state and the programmable state prior to the processor resuming execution.

19. The system as recited in claim 18, wherein the processor executing the operating system software is configured to write a state of the system to the memory prior to the memory controller, the plurality of components, and the processor powering down.

20. The system as recited in claim 19 wherein the memory is in a self refresh state during a time that the memory controller is powered down.

* * * * *